United States Patent
Chen et al.

(10) Patent No.: US 12,188,734 B2
(45) Date of Patent: Jan. 7, 2025

(54) WATER SUPPLY DEVICE AND TUBE CONNECTOR STRUCTURE THEREOF

(71) Applicant: UNIWILL TECHNOLOGY INC., Taipei (TW)

(72) Inventors: Chih-Hsien Chen, Taipei (TW); Yu-Cheng Shih, Taipei (TW); Pon-Chung Chien, Taipei (TW); Chieh-Hui Chen, Taipei (TW); Ying-Fu Chou, Taipei (TW)

(73) Assignee: UNIWILL TECHNOLOGY INC., Taipei (TW)

( * ) Notice: Subject to any disclaimer, the term of this patent is extended or adjusted under 35 U.S.C. 154(b) by 227 days.

(21) Appl. No.: 17/959,138

(22) Filed: Oct. 3, 2022

(65) Prior Publication Data

US 2023/0152049 A1    May 18, 2023

(30) Foreign Application Priority Data

Nov. 12, 2021   (TW) .................................. 110213432

(51) Int. Cl.
| | |
|---|---|
| *F28F 9/02* | (2006.01) |
| *F16L 37/40* | (2006.01) |
| *F16L 37/56* | (2006.01) |
| *G06F 1/20* | (2006.01) |
| *H05K 7/20* | (2006.01) |

(52) U.S. Cl.
CPC ............ *F28F 9/0253* (2013.01); *F16L 37/40* (2013.01); *F16L 37/56* (2013.01); *G06F 1/20* (2013.01); *H05K 7/20272* (2013.01)

(58) Field of Classification Search
CPC .............. F28F 9/0253; H05K 7/20772; H05K 7/20781; H05K 7/20272
See application file for complete search history.

(56) References Cited

U.S. PATENT DOCUMENTS

| | | | | |
|---|---|---|---|---|
| 2,701,147 | A * | 2/1955 | Summerville | ........ F16L 37/088 285/244 |
| 5,150,926 | A * | 9/1992 | Egli | ........................ F16L 39/00 285/379 |
| 6,076,409 | A * | 6/2000 | Bang | ................... G01L 19/0038 73/756 |
| 6,517,124 | B1 * | 2/2003 | Le Quere | ............ F16L 37/0915 285/379 |

(Continued)

FOREIGN PATENT DOCUMENTS

JP    2000028231 A  *  1/2000  ........... F28D 1/0341

*Primary Examiner* — Nelson J Nieves
(74) *Attorney, Agent, or Firm* — Chun-Ming Shih; HDLS IPR SERVICES

(57) ABSTRACT

A water supply device (10) and a tube connector structure (2) thereof, which are used for an electronic device (100) having a water inlet (101) and a water outlet (102), are disclosed. The tube connector structure (2) includes a connecting plate (21) and two tube connector plugs (22) passing through and fixed to the connecting plate (21). One of the tube connector plugs (22) is connected with the water inlet (101), and the other one of the tube connector plugs (22) is connected with the water outlet (102). Therefore, advantages of rapid connection and disconnection between the water supply device (10) and the tube connector structure (2) and saving time and labor in assembling may be accomplished.

7 Claims, 9 Drawing Sheets

(56) References Cited

U.S. PATENT DOCUMENTS

| | | | | |
|---|---|---|---|---|
| 6,604,370 B2* | 8/2003 | Bash | ............... | G06F 1/20 361/699 |
| 6,856,509 B2* | 2/2005 | Lin | ............... | G06F 1/20 361/679.02 |
| 6,860,290 B2* | 3/2005 | Knuthson | ............... | F16L 37/56 285/924 |
| 7,156,423 B2* | 1/2007 | Marks | ............... | F16L 39/00 285/286.1 |
| 7,878,553 B2* | 2/2011 | Wicks | ............... | A61M 39/12 285/305 |
| 7,971,910 B2* | 7/2011 | Holt | ............... | F16L 41/086 285/13 |
| 8,270,164 B2* | 9/2012 | Tang | ............... | H05K 7/20772 165/185 |
| 8,608,207 B2* | 12/2013 | Boraas | ............... | F16L 37/23 285/124.3 |
| 9,351,428 B2* | 5/2016 | Eckberg | ............... | F16L 37/34 |
| 9,388,929 B2* | 7/2016 | Lewis | ............... | A61B 5/02233 |
| 9,464,741 B2* | 10/2016 | Lewis | ............... | A61B 5/022 |
| 10,164,373 B1* | 12/2018 | Cheon | ............... | H05K 7/20781 |
| 10,711,930 B2* | 7/2020 | Lewis | ............... | F16L 37/56 |
| 11,452,237 B2* | 9/2022 | Tan | ............... | H05K 7/20272 |
| 2006/0065874 A1* | 3/2006 | Campbell | ............... | H05K 7/20772 251/348 |
| 2009/0278349 A1* | 11/2009 | Jeon | ............... | F16L 29/02 285/314 |
| 2009/0289449 A1* | 11/2009 | Hasunuma | ............... | F16L 37/23 285/33 |
| 2013/0048742 A1* | 2/2013 | Menden | ............... | F24F 5/0003 285/124.5 |
| 2013/0192800 A1* | 8/2013 | Tiberghien | ............... | H05K 7/20272 165/108 |
| 2014/0300105 A1* | 10/2014 | Kalbacher | ............... | F16L 39/00 285/351 |
| 2017/0257980 A1* | 9/2017 | Fukunaga | ............... | F16L 37/40 |
| 2017/0367217 A1* | 12/2017 | Xiao | ............... | H01L 23/467 |
| 2021/0063097 A1* | 3/2021 | Hitchcock | ............... | B60L 53/16 |
| 2021/0100138 A1* | 4/2021 | Chen | ............... | H05K 7/20272 |
| 2023/0056298 A1* | 2/2023 | Gao | ............... | H05K 7/20772 |
| 2023/0085165 A1* | 3/2023 | Gao | ............... | H05K 7/1489 361/699 |
| 2023/0129778 A1* | 4/2023 | Ruan | ............... | H01R 13/631 285/124.5 |
| 2023/0358442 A1* | 11/2023 | Liang | ............... | F24H 1/181 |

* cited by examiner

WATER SUPPLY DEVICE AND TUBE CONNECTOR STRUCTURE THEREOF

BACKGROUND

Technical Field

The disclosure relates to a water supply device for supplying water to a liquid cooler in an electronic device, particularly to a water supply device and a tube connector structure thereof.

Description of Related Art

Electronic devices such as laptop computers and tablets are installed with cooling structures to help heat dissipation. A related-art cooling structure includes a heat tube, fins and a fan. However, with the requirement of volume reduction of a cooling structure, the cooling ability of the heat tube, fins and fan appears to be insufficient.

Thus, a liquid-cooling module appears in the market. The liquid-cooling module includes a liquid-cooling tube installed in an electronic device and attached on the above-mentioned cooling structure. The liquid-cooling tube is used to rapidly carry away the heat of the cooling structure to effectively enhance the cooling efficiency of the electronic device.

However, to maintain the compactness of an electronic device, the other components of the liquid-cooling module (such as pump, water tank and evaporator) are connected externally, and the liquid-cooling tube and the other components of the liquid-cooling module are connected by tube connectors. However, too many tube connectors connected with each other one by one may be excessively time and labor consuming in the assembling process.

In view of this, the inventors have devoted themselves to the above-mentioned related art, researched intensively and cooperated with the application of science to try to solve the above-mentioned problems. Finally, the invention which is reasonable and effective to overcome the above drawbacks is provided.

SUMMARY

The disclosure provides a water supply device and a tube connector structure thereof, which utilize the connecting plate to drive two tube connector plugs to connect with the water inlet and the water outlet to accomplish advantages of rapid connection and disconnection between the water supply device and the tube connector structure and saving time and labor in assembling.

In an embodiment of the disclosure, the disclosure provides a tube connector structure used for an electronic device having a water inlet and a water outlet. The tube connector structure includes a connecting plate and two tube connector plugs passing through and fixed to the connecting plate. One of the tube connector plugs is connected with the water inlet, and the other one of the tube connector plugs is connected with the water outlet.

In an embodiment of the disclosure, the disclosure provides a water supply device used for an electronic device having a water inlet and a water outlet. The water supply device includes a water supply assembly and a tube connector structure. The water supply assembly includes a water tank, a water output tube and a water input tube. The water output tube and the water input tube communicate with the water tank. The tube connector structure includes a connecting plate and two tube connector plugs passing through and fixed to the connecting plate. One of the tube connector plugs is connected with the water inlet, and the other one of the tube connector plugs is connected with the water outlet.

According to the above description, the driving plate may synchronously drive two tube connector plugs to be jointly aligned and connected with the water inlet and the water outlet.

In comparison with the related art of two tube connector plugs are being separately connected with the water inlet and the water outlet, which is time and labor consuming, the water supply device and the tube connector structure of the disclosure further have the advantages of rapid connection and disconnection with the electronic device and saving time and labor in assembling.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
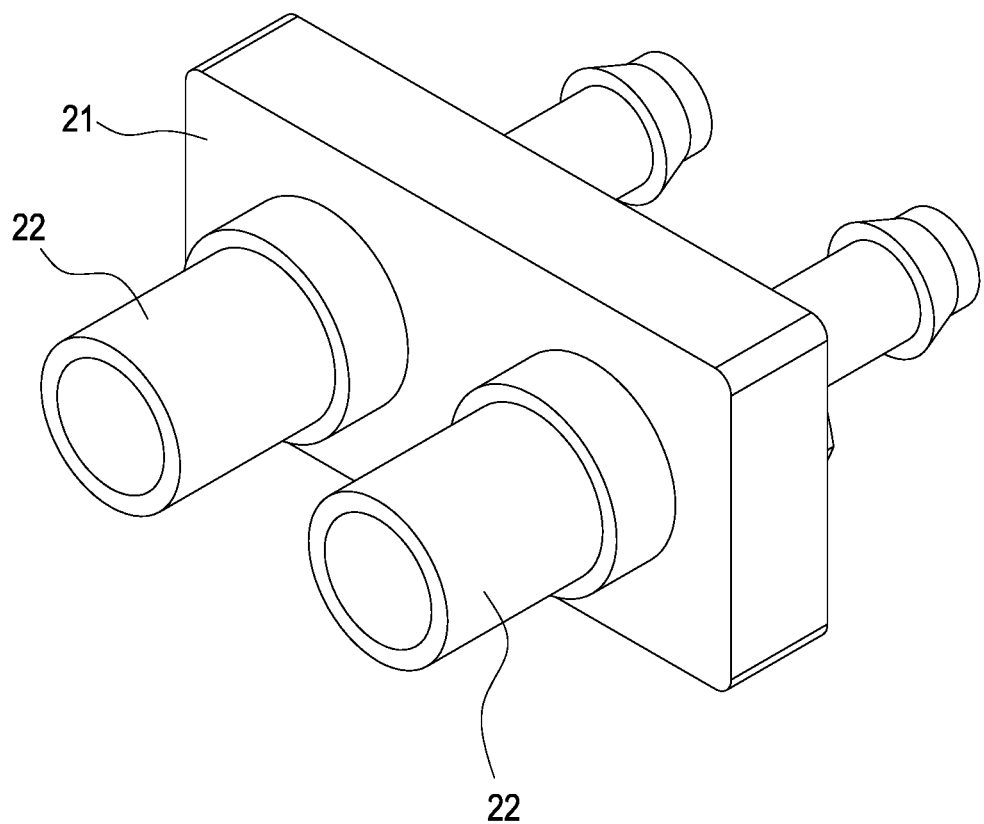
FIG. 1 is a perspective schematic view of the tube connector structure of the disclosure.
Figure 2:
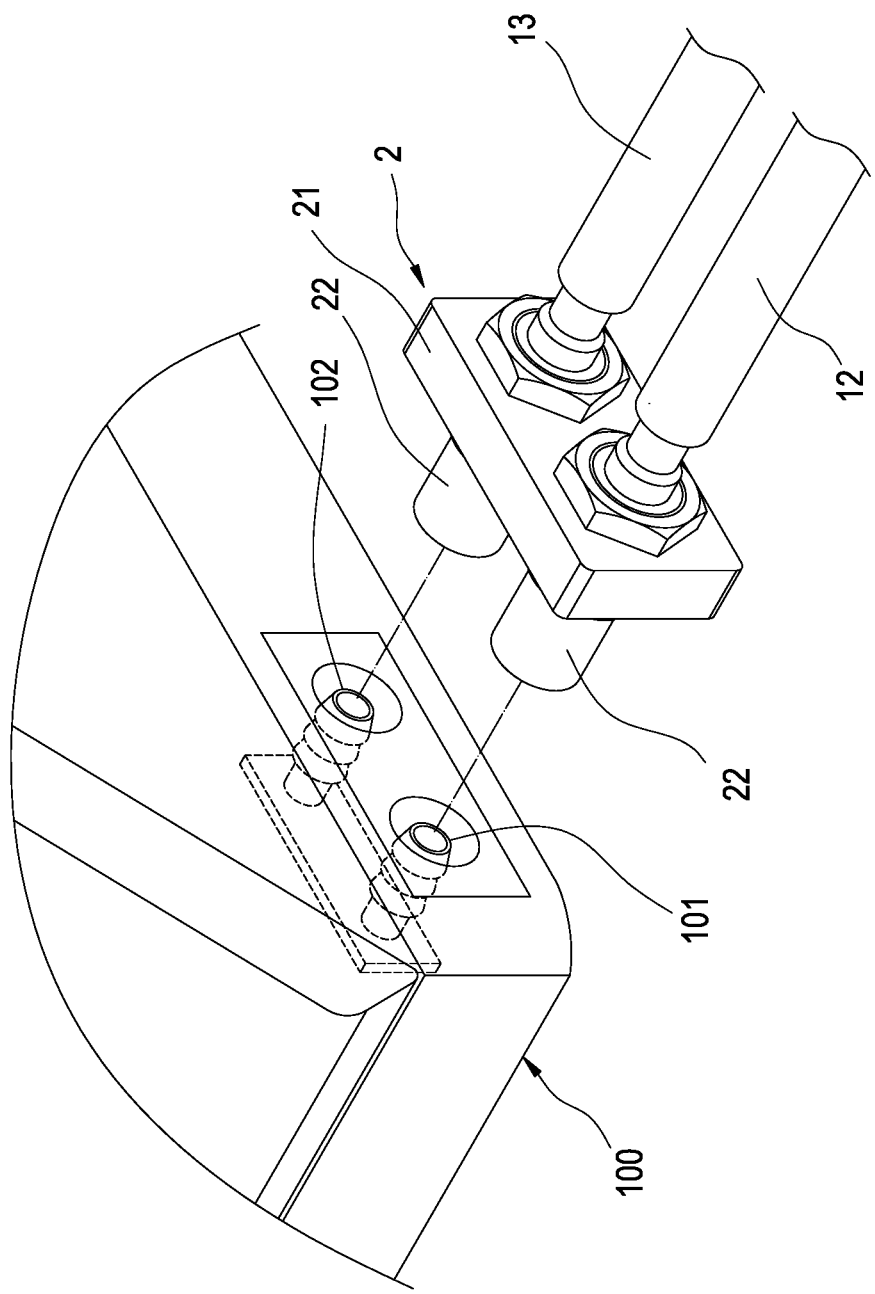
FIG. 2 is a schematic view of a using status of the tube connector structure of the disclosure.
Figure 3:
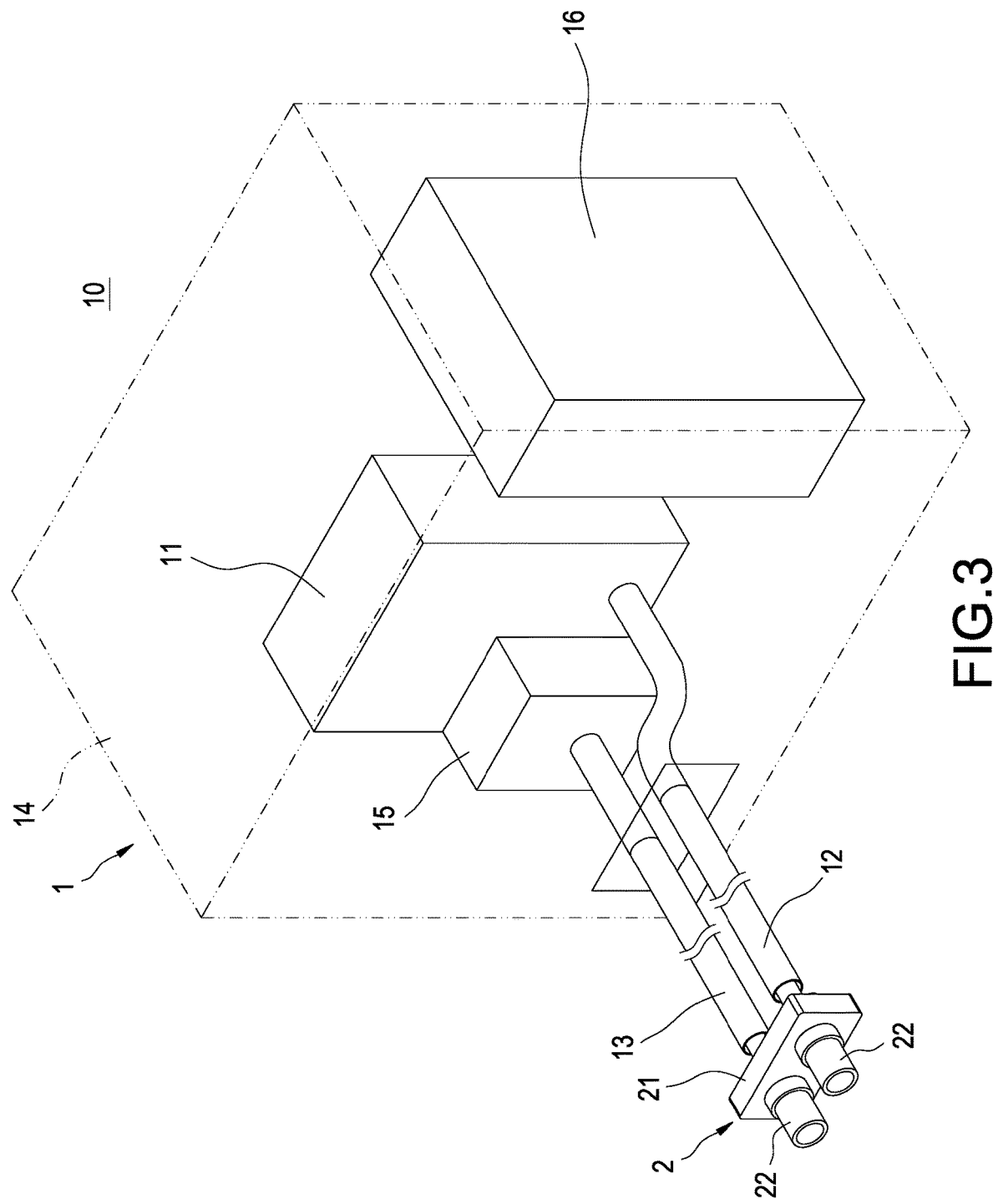
FIG. 3 is a perspective schematic view of the water supply device of the disclosure.

Please refer to FIGS. 1-3. The disclosure provides a water supply device 10 and a tube connector structure 2 thereof, which are used for an electronic device 100. There is a liquid-cooling tube (not shown in figures) in the electronic device 100. Two ends of the liquid-cooling tube are a water inlet 101 and a water outlet 102. The water supply device 10 includes a water supply assembly 1 and a tube connector structure 2. The tube connector structure 2 includes a connecting plate 21 and two tube connector plugs 22.

Please refer to FIGS. 2-3. The water supply assembly 1 includes a water tank 11, a water output tube 12, a water input tube 13, a casing 14, a pump 15 and an adapter 16. The water output tube 12 and the water input tube 13 communicate with the water tank 11. The pump 15 and the adapter 16 are received in the casing 14. The pump 15 communicates with the water tank 11. The adapter 16 is electrically connected with the pump 15 and an external electricity source to supply electricity to the pump 15.

As shown in FIGS. 1-3, the tube connector structure 2 includes a connecting plate 21 and two tube connector plugs 22 passing through and fixed to the connecting plate 21. Two ends of one of the tube connector plugs 22 are connected with the water output tube 12 and the water inlet 101, and two ends of the other one of the tube connector plugs 22 are connected with the water input tube 13 and the water outlet 102. The pump 15 is used for guiding the working fluid (not shown in figures) in the water tank 11 to flow sequentially via the water output tube 12, one of the tube connector plugs 22, the water inlet 101, the liquid-cooling tube, the water outlet 102, the other tube connector plug 22 and the water input tube 13 to back to the water tank 11.

As shown in FIGS. 2-3, which show a using status of the water supply device 10 and the tube connector structure 2 of the disclosure, the disclosure utilizes the connecting plate 21 to synchronously drive two tube connector plugs 22 to be jointly connected or disconnected with the water inlet 101 and the water outlet 102. In comparison with the related art separately connecting two tube connector plugs with the water inlet and the water outlet, the water supply device 10 and the tube connector structure 2 of the disclosure further have the advantages of rapid connection and disconnection with the electronic device 100 and saving time and labor in assembling.

Figure 4:
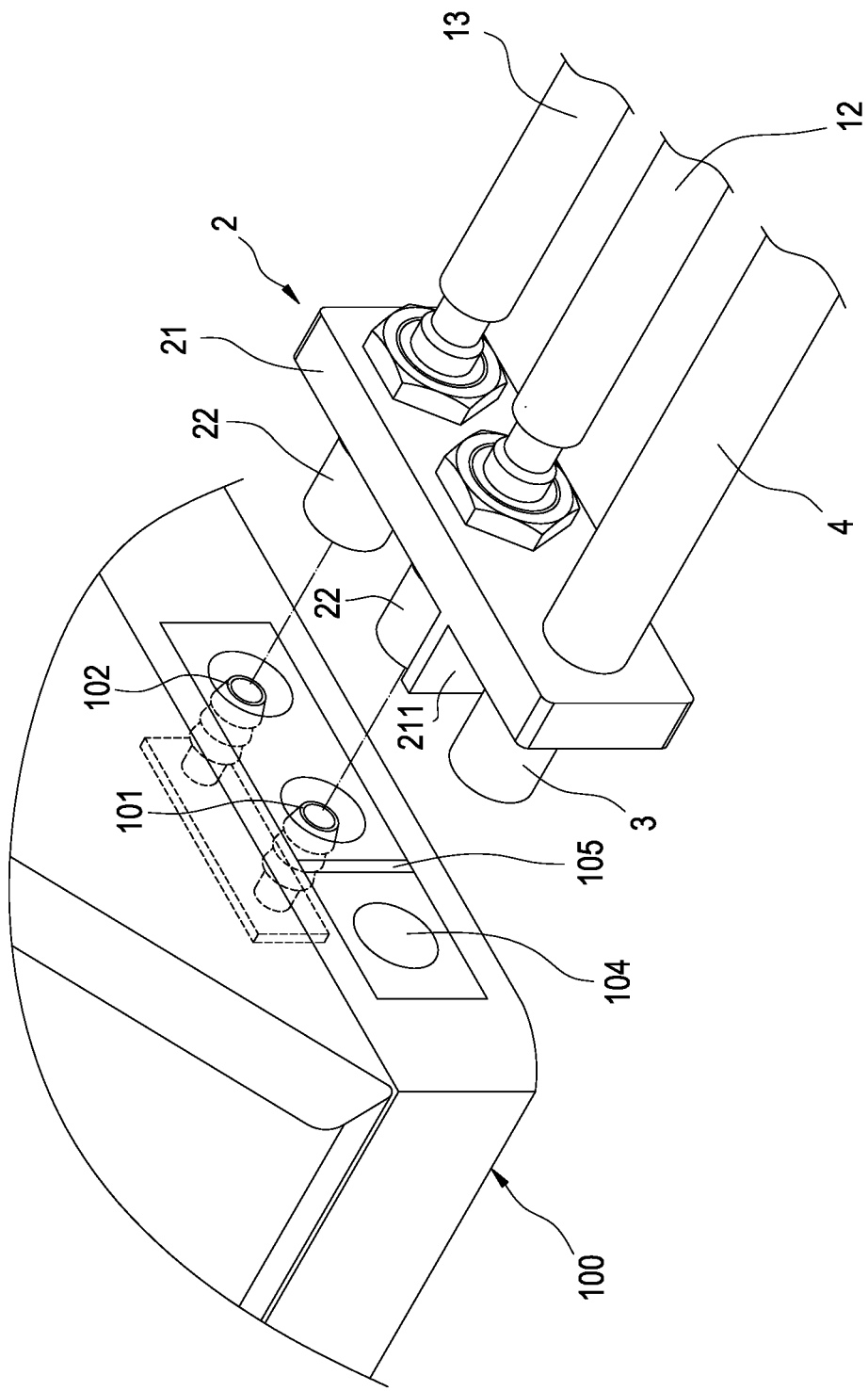
FIG. 4 is a schematic view of a using status of another embodiment of the tube connector structure of the disclosure.
Figure 5:
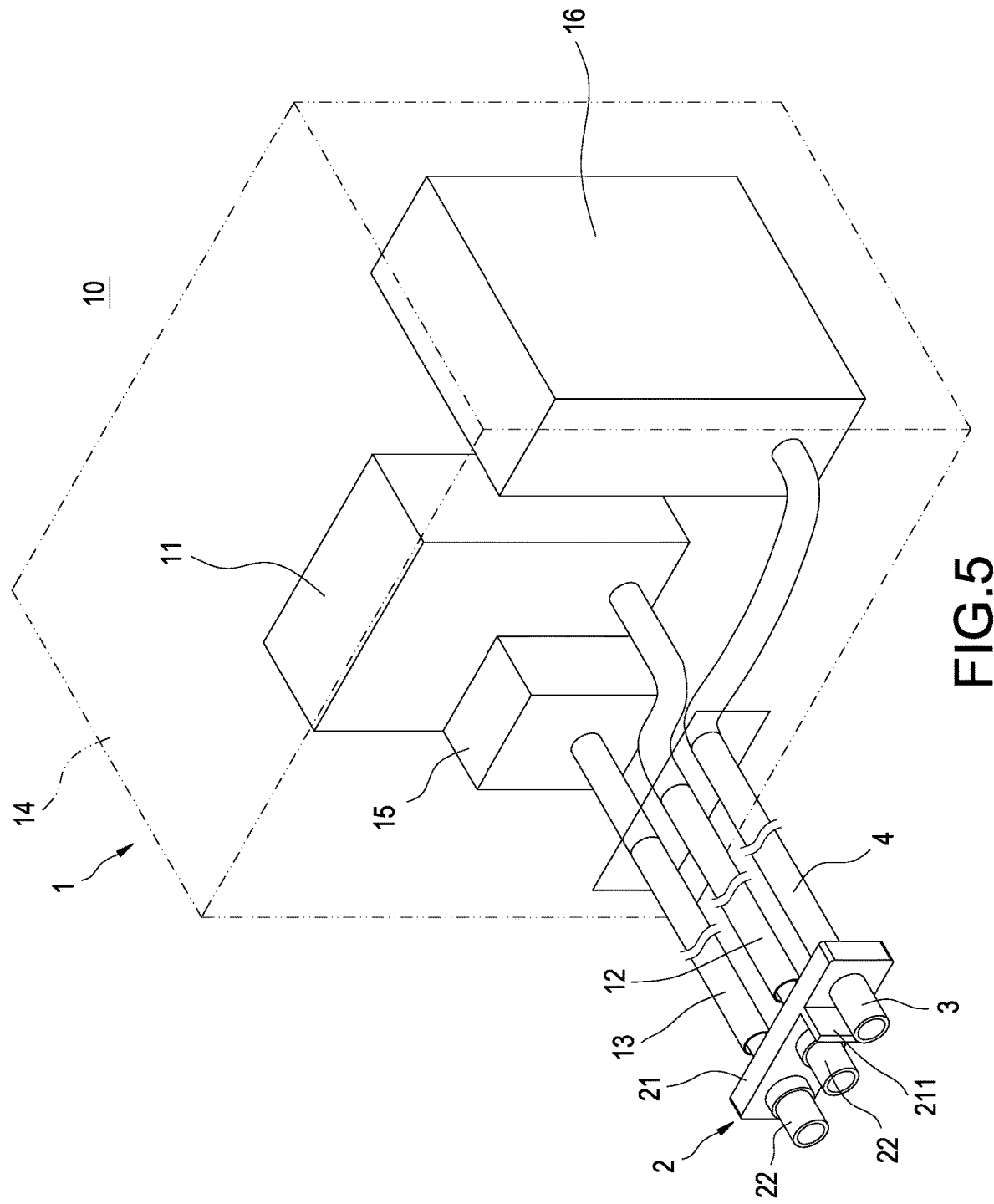
FIG. 5 is a perspective schematic view of another embodiment of the tube connector structure of the disclosure.
Figure 6:
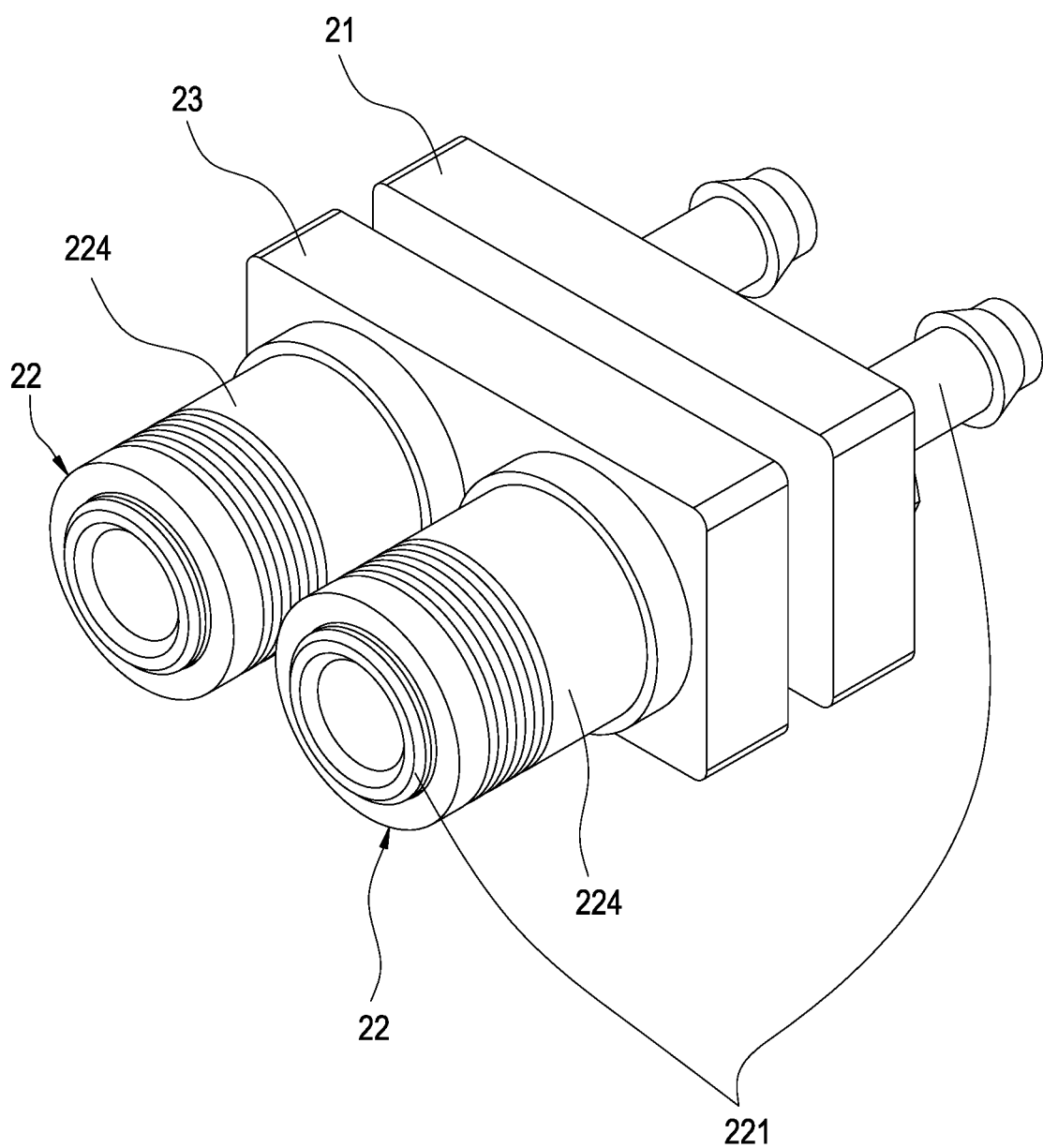
FIG. 6 is a perspective schematic view of still another embodiment of the tube connector structure of the disclosure.
Figure 7:
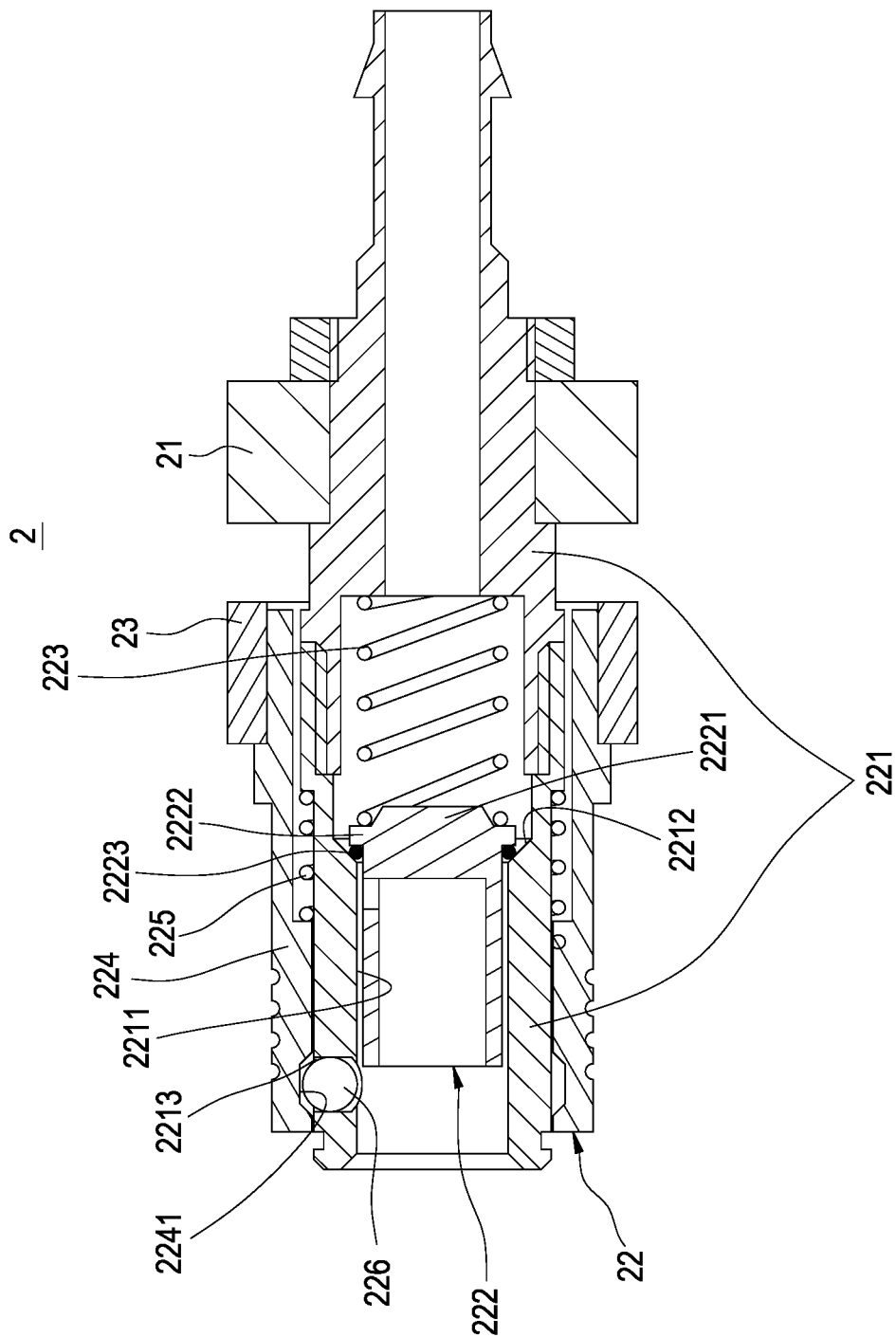
FIG. 7 is a cross-sectional schematic view of still another embodiment of the tube connector structure of the disclosure.
Figure 8:
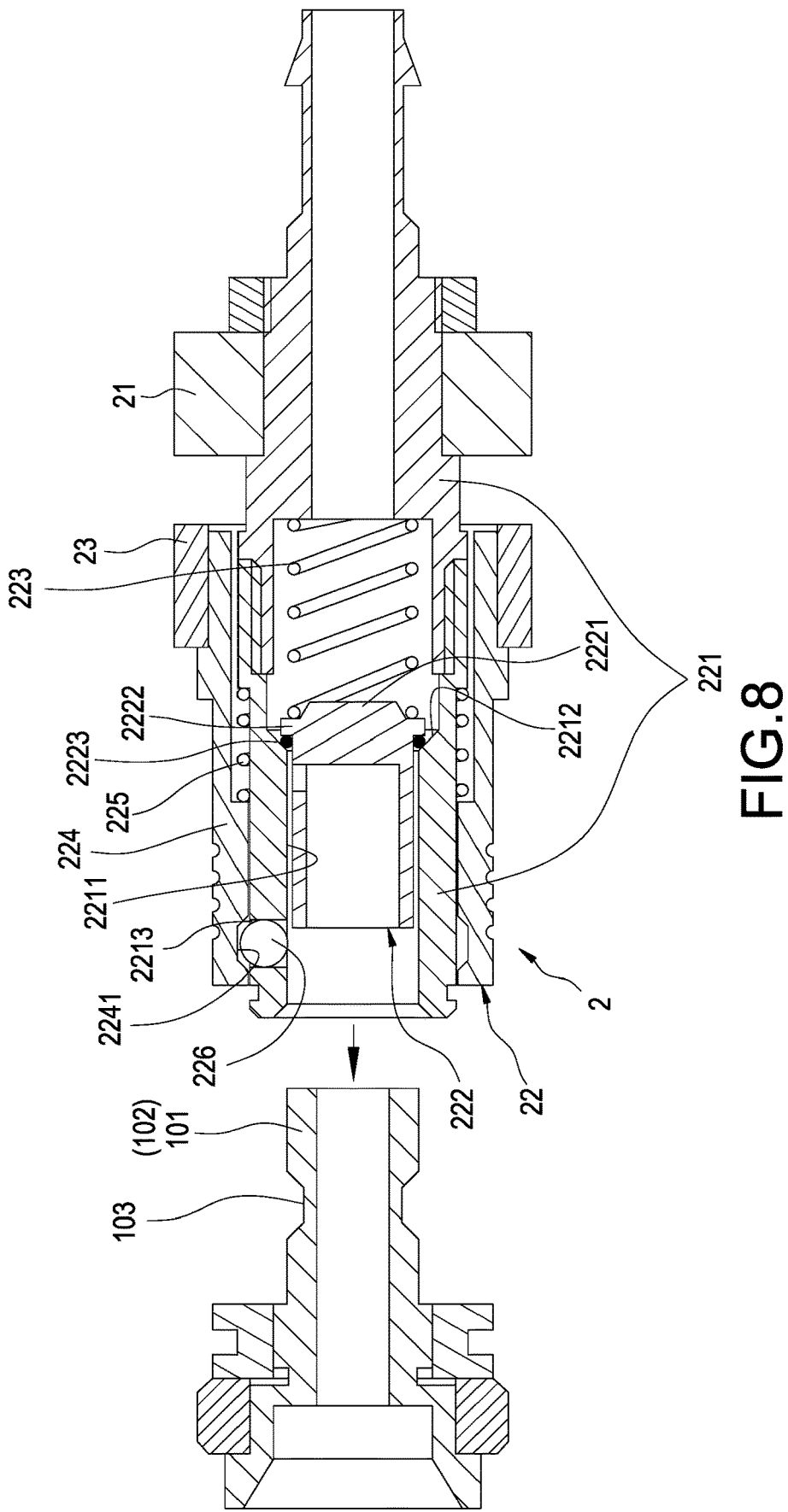
FIG. 8 is a schematic view of a using status of still another embodiment of the tube connector structure of the disclosure.
Figure 9:
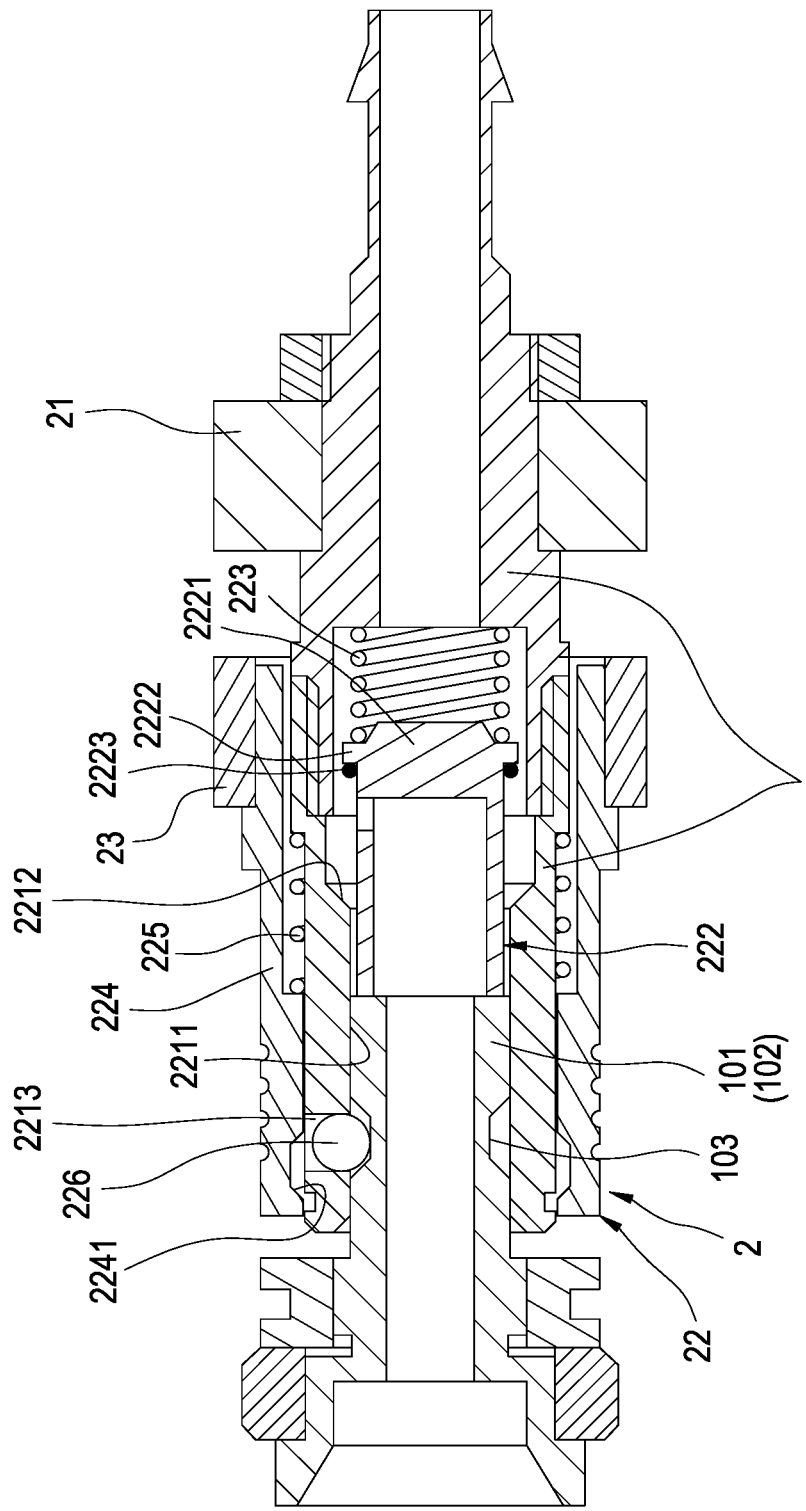
FIG. 9 is a schematic view of another using status of still another embodiment of the tube connector structure of the disclosure.

Please refer to FIGS. 4-5, which show another embodiment of the water supply device 10 and the tube connector structure 2 of the disclosure. The embodiment of FIGS. 4-5 is substantially the same as the embodiment of FIGS. 1-3. The embodiment of FIGS. 4-5 differs from the embodiment of FIGS. 1-3 by the tube connector structure 2 further including a connector 3 and a transmission wire 4.

In detail, the electronic device 100 is disposed with an electricity source socket 104 and a recess 105. The connector 3 passes through and is fixed to the connecting plate 21 and connected to the electricity source socket 104. Two ends of the transmission wire 4 are electrically connected with the adapter 16 and the connector 3. The connecting plate 21 includes a separator sheet 211 extended therefrom and arranged between the connector 3 and the two tube connector plugs 22. The separator sheet 211 is adapted to be embeddable into the recess 105.

Therefore, when the electronic device 100 is in a state of insufficient electricity, the adapter 16 may supply electricity to the electronic device 100 through the connector 3, the transmission wire 4 and the electricity source socket 104. The inside of the adapter 16 may include a computing and data processing unit. The adapter 16 may transmit data to the electronic device 100 through the connector 3.

In addition, the connecting plate 21 is extended with a separator sheet 211 between the connector 3 and the two tube connector plugs 22 to make the separator sheet 211 provide a splash-proof and water-resistant function to prevent he working fluid (not shown in figures) from leaking to the connector 3 when the working fluid leaks at the two tube connector plugs 22.

Further, the connecting plate 21 may synchronously drive the two tube connector plugs 22 and the connector 3 to be jointly connected or disconnected with the water inlet 101, the water outlet 102 and the electricity source socket 104 to make the water supply device 10 and the tube connector structure 2 be rapidly connected or disconnected with the electronic device 100 and to save time and labor in assembling.

Please refer to FIGS. 6-9, which show still another embodiment of the tube connector structure 2 of the disclosure. The embodiment of FIGS. 6-9 is substantially the same as the embodiment of FIGS. 1-3. The embodiment of FIGS. 6-9 differs from the embodiment of FIGS. 1-3 by the tube connector structure 2 further including more detailed features.

In detail, each tube connector plug 22 includes a main tube 221, a water blocking member 222 and a first return spring 223. Each main tube 221 passes through and is fixed to the connecting plate 21. An inner wall of each main tube 221 is extended with an inner annular block 2211. Each water blocking member 222 movably passes each main tube 221. Each first return spring 223 is clamped between each main tube 221 and each water blocking member 222 and pushes each water blocking member 222 to abut against each inner annular block 2211 so as to make each main tube 221 be closed by each water blocking member 222.

Please refer back to FIG. 2. Two ends of one of the main tubes 221 of the embodiment of FIGS. 6-9 are separately connected to the water output tube 12 and the water inlet 101, and two ends of the other one of the main tubes 221 are separately connected to the water input tube 13 and the water outlet 102.

In addition, when the water inlet 101 or the water outlet 102 is inserted into the main tube 221, the water inlet 101 or the water outlet 102 may push the water blocking member 222 to move away from the inner annular block 2211 to make the main tube 221 open to allow the working fluid (not shown in figures) to flow into the water inlet 101 or the water outlet 102 from the main tube 221.

Additionally, each water blocking member 222 includes a block body 2221 and an O-ring 2223. Each block body 2221 movably passes each main tube 221. An outer wall of each block body 2221 is extended with an outer annular block 2222. Each O-ring 2223 is disposed around each block body 2221 and may be clamped between each inner annular block 2211 and each outer annular block 2222. An end of each inner annular block 2211 adjacent to each O-ring 2223 is formed with a slant annular groove 2212. The depth of the slant annular groove 2212 is gradually decreased toward a direction away from each O-ring 2223. An inner wall of the slant annular groove 2212 is configured to gradually guide the O-ring 2223 to be tightly attached to the inner annular block 2211 to firmly close the main tube 221 to prevent the working fluid from leaking at the main tube 221.

Furthermore, each of the water inlet 101 and the water outlet 102 is disposed with a trough 103. Each tube connector plug 22 further includes a locking sleeve 224, a second return spring 225 and a steel ball 226. Each locking sleeve 224 movably sheathes each main tube 221. An inner wall of each locking sleeve 224 is disposed with an engaging indent 2241. An inner wall of each main tube 221 is formed with a depression 2213. Each second return spring 225 is clamped between each main tube 221 and each locking sleeve 224 and pushes each locking sleeve 224 to a return position where each engaging indent 2241 is staggered with each depression 2213. Each steel ball 226 may be clamped between each trough 103 and each depression 2213 or between each engaging indent 2241 and each depression 2213.

Also, the tube connector structure 2 further includes a driving plate 23. The locking sleeves 224 of the two tube connector plugs 22 pass through and are fixed to the driving plate 23 and move with the driving plate 23.

Therefore, when the water inlet 101 or the water outlet 102 is inserted into the main tube 221 and reaches a status of the trough 103 being aligned with the depression 2213, the steel ball 226 is clamped between the trough 103 and the depression 2213, and the steel ball 226 escapes from the engaging indent 2241. Thus, the second return spring 225 pushes the locking sleeve 224 to the return position where the engaging indent 2241 is staggered with the depression 2213. Because the engaging indent 2241 is staggered with the depression 2213, the steel ball 226 is not able to enter the engaging indent 2241 and being continuously clamped between the trough 103 and the depression 2213 to make the steel ball 226 lock the water inlet 101 or the water outlet 102 to further make the two main tubes 221 be firmly assembled with the water inlet 101 or the water outlet 102.

After that, the driving plate 23 may synchronously drive two locking sleeves 224 to jointly move to a position where the engaging indent 2241 is aligned with the depression 2213. The whole tube connector structure 2 may further be moved toward a direction away from the water inlet 101 or the water outlet 102. The steel 226 escapes from the trough 103 to be clamped between the engaging indent 2241 and the depression 2213. At the same time, the steel ball 226 does not lock the water inlet 101 or the water outlet 102, so the two main tubes 221 may be synchronously removed and separated from the water inlet 101 or the water outlet 102. That may accomplish the advantages of rapid and synchronous connection and disconnection between the tube connector structure 2 and the electronic device 100 and saving time and labor in assembling.

While this disclosure has been described by means of specific embodiments, numerous modifications and variations could be made thereto by those skilled in the art without departing from the scope and spirit of this disclosure set forth in the claims.

What is claimed is:

1. A tube connector structure for an electronic device (100), the electronic device (100) comprising a water inlet (101) and a water outlet (102), the tube connector structure (2) comprising:
   a connecting plate (21); and
   two tube connector plugs (22), passing through and fixed to the connecting plate (21), one of the tube connector plugs (22) connected with the water inlet (101), and another one of the tube connector plugs (22) connected with the water outlet (102);
   wherein each tube connector plug (22) comprises a main tube (221), a water blocking member (222) and a first return spring (223), the main tube (221) passes through and is fixed to the connecting plate (21), an inner annular block (2211) is extended on an inner wall of the main tube (221), the water blocking member (222) movably passes the main tube (221), the first return spring (223) is clamped between the main tube (221) and the water blocking member (222) and configured to push the water blocking member (222) to abut against the inner annular block (2211), and the water inlet (101) or the water outlet (102) is configured to push the water blocking member (222) to move away from the inner annular block (2211) when being inserted into the main tube (221);
   wherein each water blocking member (222) comprises a block body (2221) and an O-ring (2223), the block body (2221) movably passes the main tube (221), an outer annular block (2222) is extended on an outer wall of the block body (2221), the O-ring (2223) is disposed around the block body (2221) and clamped between the inner annular block (2211) and the outer annular block (2222), and a slant annular groove (2212) is disposed on an end of the inner annular block (2211) adjacent to the O-ring (2223), a depth of the slant annular groove (2212) is gradually decreased toward a direction away from the O-ring (2223).

2. The tube connector structure of claim 1, wherein each of the water inlet (101) and the water outlet (102) comprises a trough (103), each tube connector plug (22) further comprises a locking sleeve (224), a second return spring (225) and a steel ball (226), the locking sleeve (224) is movably sheathe the main tube (221), an engaging indent (2241) is disposed on an inner wall of the locking sleeve (224), a depression (2213) is disposed on an inner wall of the main tube (221), the second return spring (225) is clamped between the main tube (221) and the locking sleeve (224) and configured to push the locking sleeve (224) to a return position where the engaging indent (2241) is staggered with the depression (2213), and the steel ball (226) is clamped between the trough (103) and the depression (2213) or between the engaging indent (2241) and the depression (2213).

3. The tube connector structure of claim 2, further comprising a driving plate (23), wherein multiple locking sleeves (224) of the two tube connector plugs (22) pass and are fixed to the driving plate (23) and configured to move with the driving plate (23).

4. A water supply device for an electronic device (100), the electronic device (100) comprising a water inlet (101) and a water outlet (102), the water supply device (10) comprising:
   a water supply assembly (1), comprising a water tank (11), a water output tube (12) and a water input tube (13), and the water output tube (12) and the water input tube (13) communicating with the water tank (11); and
   a tube connector structure (2) comprising:
   a connecting plate (21); and
   two tube connector plugs (22), passing through and fixed to the connecting plate (21), one of the tube connector plugs (22) connected with the water inlet (101), and another one of the tube connector plugs (22) connected with the water outlet (102);
   wherein each tube connector plug (22) comprises a main tube (221), a water blocking member (222) and a first return spring (223), the main tube (221) passes through and is fixed to the connecting plate (21), an inner annular block (2211) is extended on an inner wall of the main tube (221), the water blocking member (222) movably passes the main tube (221), the first return spring (223) is clamped between the main tube (221) and the water blocking member (222) and configured to push the water blocking member (222) to abut against the inner annular block (2211), and the water inlet (101) or the water outlet (102) is configured to push the water blocking member (222) to move away from the inner annular block (2211) when being inserted into the main tube (221);
   wherein each water blocking member (222) comprises a block body (2221) and an O-ring (2223), the block body (2221) movably passes the main tube (221), an outer annular block (2222) is extended on an outer wall of the block body (2221), the O-ring (2223) is disposed around the block body (2221) and clamped between the inner annular block (2211) and the outer annular block (2222), and a slant annular groove (2212) is disposed on an end of the inner annular block (2211) adjacent to the O-ring (2223), a depth of the slant annular groove (2212) is gradually decreased toward a direction away from the O-ring (2223).

5. The water supply device of claim 4, wherein each of the water inlet (101) and the water outlet (102) comprises a trough (103), each tube connector plug (22) further comprises a locking sleeve (224), a second return spring (225) and a steel ball (226), the locking sleeve (224) is movably sheathe the main tube (221), an engaging indent (2241) is disposed on an inner wall of the locking sleeve (224), a depression (2213) is disposed on an inner wall of the main tube (221), the second return spring (225) is clamped between the main tube (221) and the locking sleeve (224) and configured to push the locking sleeve (224) to a return position where the engaging indent (2241) is staggered with the depression (2213), and the steel ball (226) is clamped between the trough (103) and the depression (2213) or between the engaging indent (2241) and the depression (2213).

6. The water supply device of claim 5, wherein the tube connector structure (2) further comprises a driving plate (23), multiple locking sleeves (224) of the two tube connector plugs (22) pass and are fixed to the driving plate (23) and configured to move with the driving plate (23).

7. The water supply device of claim 5, further comprising a connector (3) and a transmission wire (4), wherein the electronic device (100) comprises an electricity source socket (104) and a recess (105), the water supply assembly (1) further comprises a casing (14), a pump (15) and an adapter (16), the pump (15) and the adapter (16) are received in the casing (14), the pump (15) communicates with the water tank (11), the adapter (16) is electrically connected with the pump (15), the connector (3) passes through and is fixed to the connecting plate (21) and connected to the electricity source socket (104), two ends of the transmission wire (4) are electrically connected with the adapter (16) and the connector (3) respectively, and a separator sheet (211) is extended from the connecting plate (21) between the connector (3) and the two tube connector plugs (22) to be embedded in the recess (105).

\* \* \* \* \*